US006753573B2

United States Patent
Nakabayashi

(10) Patent No.: US 6,753,573 B2
(45) Date of Patent: Jun. 22, 2004

(54) SEMICONDUCTOR DEVICE HAVING COMPLEMENTARY MOS TRANSISTOR

(75) Inventor: Masakazu Nakabayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/390,024

(22) Filed: Mar. 18, 2003

(65) Prior Publication Data
US 2004/0084723 A1 May 6, 2004

(30) Foreign Application Priority Data
Nov. 6, 2002 (JP) ........................ 2002-322075

(51) Int. Cl.$^7$ ............................. H01L 29/76
(52) U.S. Cl. .................. 257/330; 257/331; 257/329; 257/401; 257/368; 257/900
(58) Field of Search .................. 257/330, 331–334, 257/329, 401, 368, 900

(56) References Cited

U.S. PATENT DOCUMENTS

| 5,063,175 A | 11/1991 | Broadbent |
| 5,245,210 A | 9/1993 | Nishigoori |

FOREIGN PATENT DOCUMENTS

| EP | 552445 A2 | * | 7/1993 |
| JP | 56058267 A | * | 5/1981 |
| JP | 58003287 A | * | 1/1983 |
| JP | 61-93656 | | 5/1986 |
| JP | 62-165356 | | 7/1987 |
| JP | 63-5554 | | 1/1988 |
| JP | 63-237558 | | 10/1988 |
| JP | 01-295461 | | 11/1989 |
| JP | 05-110036 | | 4/1993 |
| JP | 05-129542 | | 5/1993 |
| JP | 05-291518 | | 11/1993 |

* cited by examiner

Primary Examiner—Nathan J. Flynn
Assistant Examiner—Remmon R. Fordé
(74) Attorney, Agent, or Firm—McDermott, Will & Emery

(57) ABSTRACT

A P-well region and an N-well region are formed in an upper layer of a silicon wafer. A shallow trench having a depth of 0.05 μm to 0.1 μm is formed in the vicinity of a boundary between the P-well region and the N-well region. A gate oxide film is formed on an entire surface of the silicon wafer. On a bottom of the shallow trench of the P-well region and the outer layer of the silicon wafer contacting the upper ends of the sidewall of the shallow trench are formed n$^+$-diffusion layers. On the bottom of the shallow trench of the N-well region and the outer layer of the silicon wafer contacting the upper ends of the sidewall of the shallow trench are formed p$^+$-diffusion layers. On the sidewalls of the shallow trench, gate electrodes are formed through the gate oxide film. A silicon oxide film is formed so as to cover the gate electrodes. Electrodes contacting the diffusion layers are formed through the silicon oxide film.

3 Claims, 7 Drawing Sheets

US 6,753,573 B2

SEMICONDUCTOR DEVICE HAVING COMPLEMENTARY MOS TRANSISTOR

BACKGROUND OF THE INVENTION

1. Field of the Invention

The present invention relates to a semiconductor device, and more particularly to a densification and a size reduction (miniaturization) of a complementary MOS transistor.

2. Description of the Background Art

Heretofore, in order to highly densify a transistor, the transistor is made to have a vertical structure, as disclosed in Japanese Patent Laid-Open No. 61-93656 (1986).

There is also a structure wherein a gate electrode of a complementary transistor is buried in a trench formed in a substrate, as disclosed in Japanese Patent Laid-Open No. 62-165356 (1987).

However, a conventional semiconductor device and a method of manufacturing the same have problems of a large number of diffusion layers, and increase in the number of process steps.

Also, since the conventional manufacturing method includes an epitaxial growth step, there is a problem of change in the profile of impurity content due to the thermal history thereof. Therefore, the problem that the process control is difficult arises.

SUMMARY OF THE INVENTION

The present invention has been conceived to solve the previously-mentioned problems and a general object of the present invention is to provide a novel and useful semiconductor device.

A more specific object of the present invention is to facilitate the densification and size reduction of semiconductor devices.

The above object of the present invention is attained by a following semiconductor device.

According to one aspect of the present invention, the semiconductor device comprises a substrate in which a shallow trench having a depth of 0.05 $\mu$m to 0.1 $\mu$m is formed. A gate insulating film formed on sidewalls and a bottom of the shallow trench, and a surface of the substrate contacting upper ends of the sidewalls. Gate electrodes formed on the both sidewalls of the shallow trench each through the gate insulating film. Impurity diffusion layers formed on the bottom of the shallow trench, and the surface of the substrate contacting the upper ends of the sidewalls of the shallow trench.

Other objects and further features of the present invention will be apparent from the following detailed description when read in conjunction with the accompanying drawings.

DETAILED DESCRIPTION OF THE PREFERRED EMBODIMENTS

Figure 1:
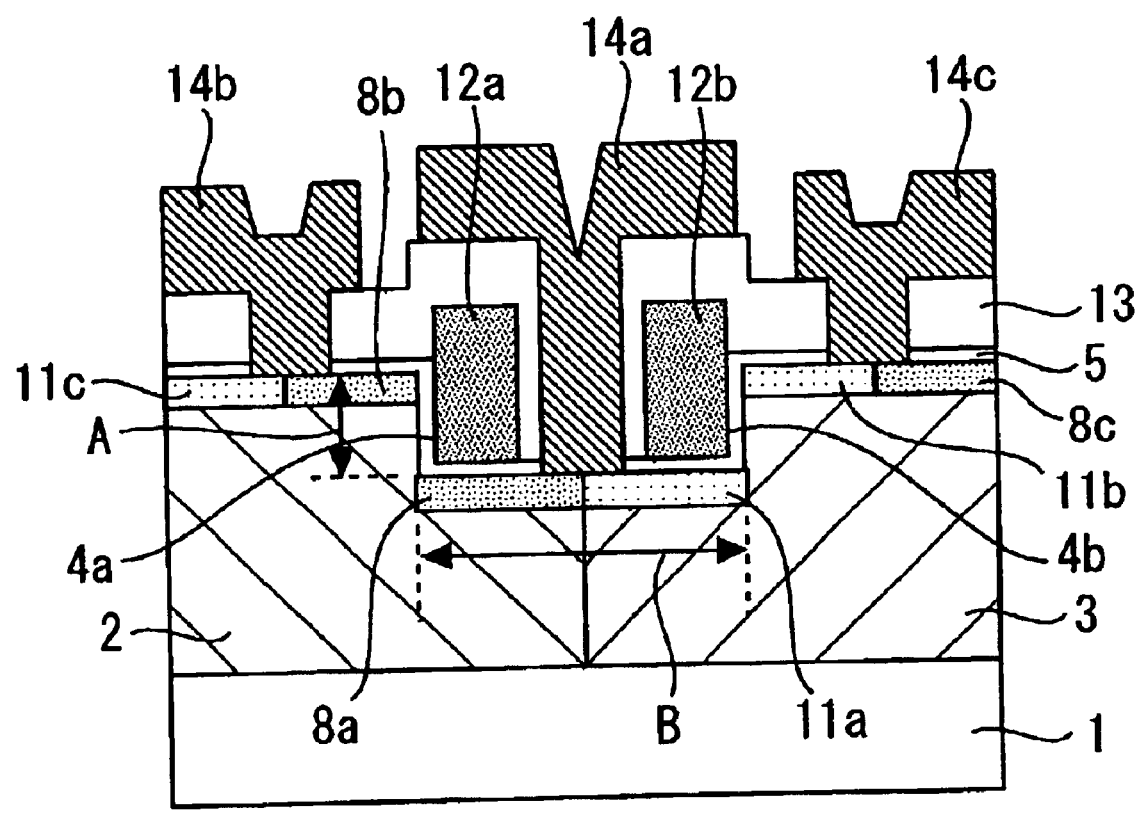
FIG. 1 is a sectional view for illustrating a semiconductor device according to an embodiment of the present invention.

In the following, principles and embodiments of the present invention will be described with reference to the accompanying drawings. The members and steps that are common to some of the drawings are given the same reference numerals and redundant descriptions therefore may be omitted.

FIG. 1 is a sectional view for illustrating a semiconductor device according to an embodiment of the present invention. Specifically, FIG. 1 is a sectional view for illustrating a complementary MOS transistor (CMOS transistor) according to an embodiment of the present invention.

As shown in FIG. 1, a P-well region, which is a first-conductivity-type impurity region 2, is formed in the N-channel transistor forming region of a silicon wafer (substrate) 1, and an N-well region, which is a second-conductivity-type impurity region 3, is formed in the P-channel transistor forming region. In the vicinity of the boundary between the P-well region 2 and the N-well region 3, a shallow trench 4 having a depth A of, for example, 0.05 $\mu$m to 0.1 $\mu$m, and a width B of 1 $\mu$m to 2 $\mu$m is formed. On a sidewall 4a of the shallow trench 4 is formed the gate electrode 12a of the N-channel transistor through a gate oxide film 5, and on the other sidewall 4b opposing the sidewall 4a is formed the gate electrode 12b of the P-channel transistor through the gate oxide film 5. Here, the upper surfaces of the gate electrodes 12a and 12b are higher than the surface of the silicon substrate 1. That is, the upper portions of the gate electrodes 12a and 12b are exposed outwardly from the shallow trench 4. Between the two gate electrodes 12a and 12b is formed an output terminal (OUT) 14a through a silicon oxide film, which is an interlayer insulating film 13. The gate oxide film 5 is also formed on the bottom and the sidewalls 4a and 4b of the shallow trench 4, and the upper surface of the silicon wafer 1 contacting the upper ends of the sidewalls 4a and 4b.

On the bottom of the shallow trench 4 of the P-well region 2, and the outer layer of the silicon wafer 1 contacting the upper ends of the sidewalls 4a of the shallow trench 4 are formed n$^+$-diffusion layers 8a and 8b as second conductivity type diffusion layers, respectively. Here, the n$^+$-diffusion layer 8a acts as the source electrode of the N-channel transistor, and the n$^+$-diffusion layer 8b acts as the drain electrode of the N-channel transistor.

On the bottom of the shallow trench 4 of the N-well region 3, and the outer layer of the silicon wafer 1 contacting the upper ends of the sidewalls 4b of the shallow trench 4 are formed p$^+$-diffusion layers 11a and 11b as first conductivity type diffusion layer, respectively. Here, the p$^+$-diffusion layer 11a acts as the source electrode of the P-channel transistor, and the p$^+$-diffusion layer 11b acts as the drain electrode of the P-channel transistor.

On the upper layer of the silicon wafer 1, a p$^+$-diffusion layer 11c is formed so as to contact the n+-diffusion layer 8b, and an n$^+$-diffusion layer 8c is formed so as to contact the p$^+$-diffusion layer 11b. In addition, a grounding terminal (GND) 14b is formed through a silicon oxide film 13 and the gate oxide film 5 so as to contact both the n$^+$-diffusion layer 8b and the p$^+$-diffusion layer 11c. A power terminal (VDD) 14c is formed through the silicon oxide film 13 and the gate oxide film 5 so as to contact both the p$^+$-diffusion layer 11b and the n$^+$-diffusion layer 8c.

Although not shown, an input terminal (IN) that contacts both the two gate electrodes 12a and 12b is formed.

Next, a method of manufacturing the above-described semiconductor device will be described.

FIGS. 2 to 13 are sectional views for illustrating a method of manufacturing a semiconductor device according to an embodiment of the present invention.

Figure 2:
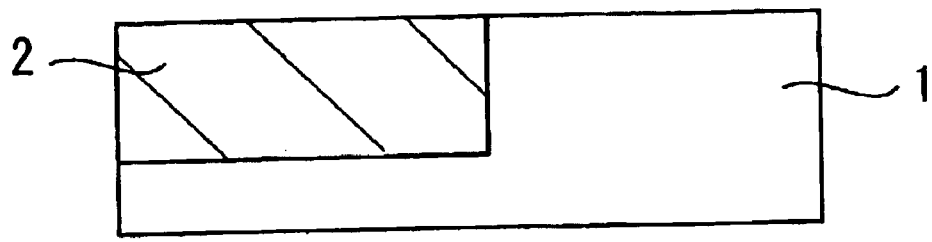
FIGS. 2 to 13 are sectional views for illustrating a method of manufacturing a semiconductor device according to an embodiment of the present invention.

First, as shown in FIG. 2, a P-well region 2 is formed in the N-channel transistor forming region of the silicon wafer 1.

Figure 3:
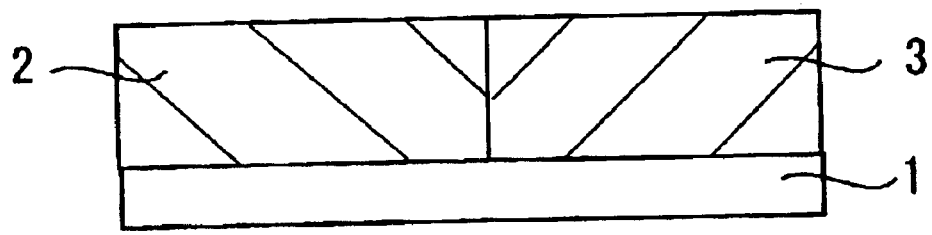

Next, as shown in FIG. 3, an N-well region 3 is formed in the P-channel transistor forming region adjacent to the P-well region 2.

Figure 4:
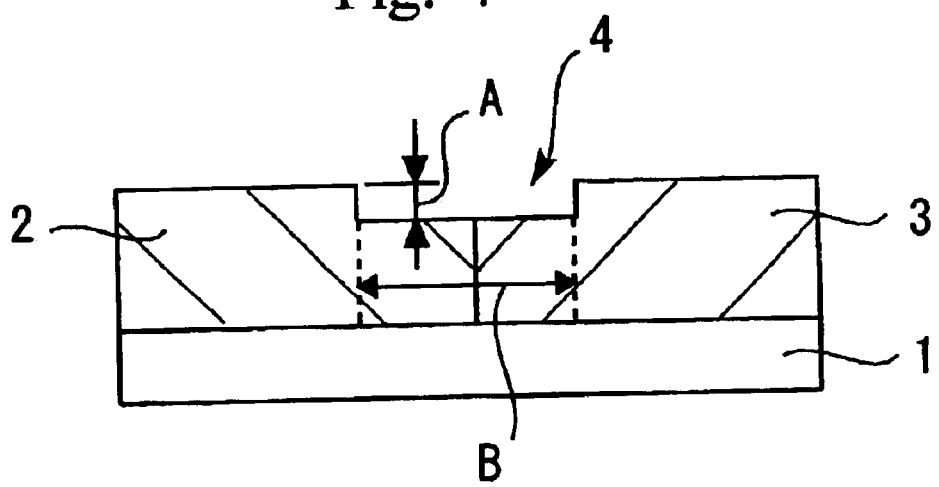

Then, as shown in FIG. 4, a shallow trench 4 is formed in the vicinity of the boundary between the P-well region 2 and the N-well region 3. Here, the depth A of the shallow trench 4 is, for example, 0.05 μm to 0.1 μm, and the width B of the shallow trench 4 is, for example, 1 μm to 2 μm.

Figure 5:
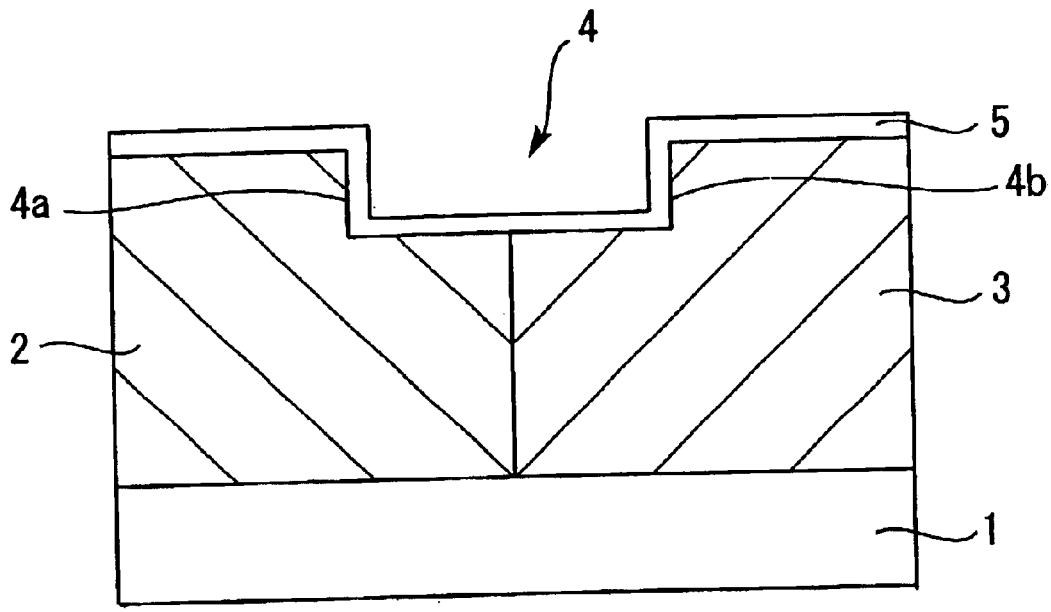

Next, as shown in FIG. 5, a gate oxide film 5 of a thickness of about 5 nm is formed on the entire surface of the silicon wafer 1 using a thermal oxidation method. Thereby, the gate oxide film 5 is formed on the sidewalls 4a, 4b and the bottom of the shallow trench 4, and on the surface of the P-well region 2 and the N-well region 3.

Figure 6:
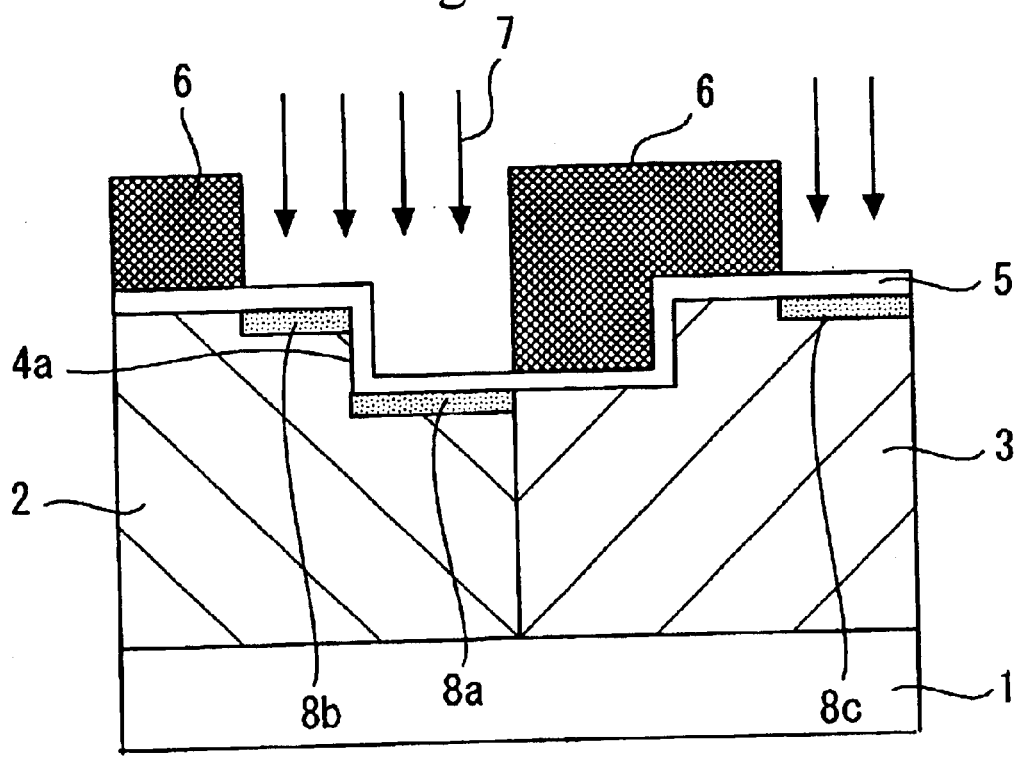

Then, as shown in FIG. 6, a resist pattern 6 is formed, and n$^+$-diffusion layers 8a, 8b, and 8c are formed by ion implantation of an N-type impurity (e.g., As ions) 7 using the resist pattern 6 as a mask. Thereafter, the resist pattern 6 is removed.

Figure 7:
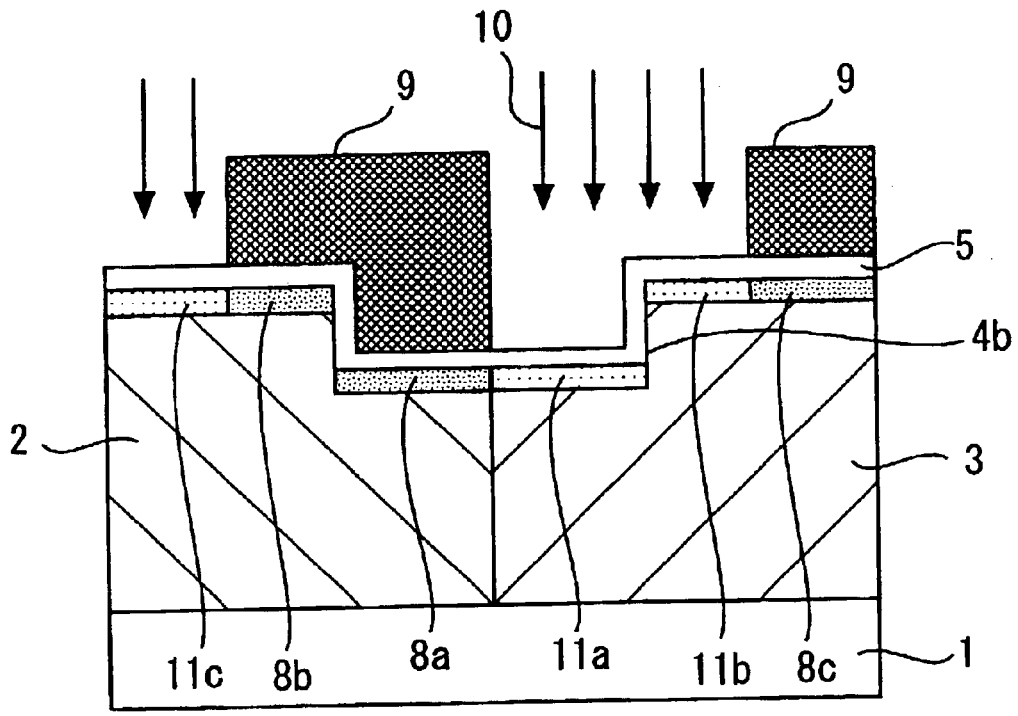

Next, as shown in FIG. 7, a resist pattern 9 is formed, and p$^+$-diffusion layers 11a, 11b, and 11c are formed by ion implantation of a P-type impurity (e.g., B ions) 10 using the resist pattern 9 as a mask.

Figure 8:
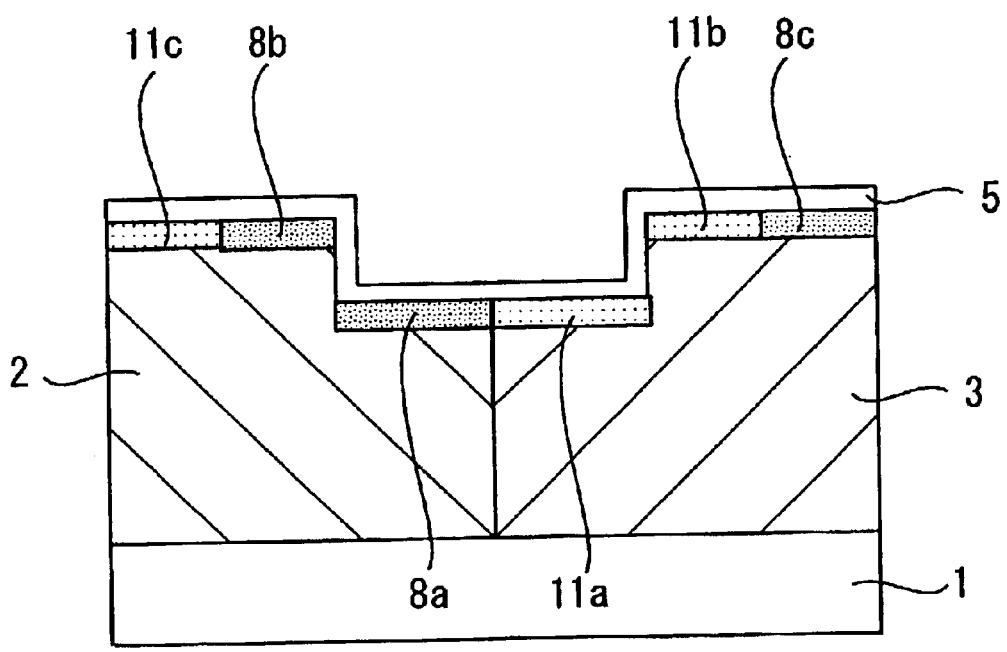

Then, as shown in FIG. 8, the resist pattern 9 is removed.

Figure 9:
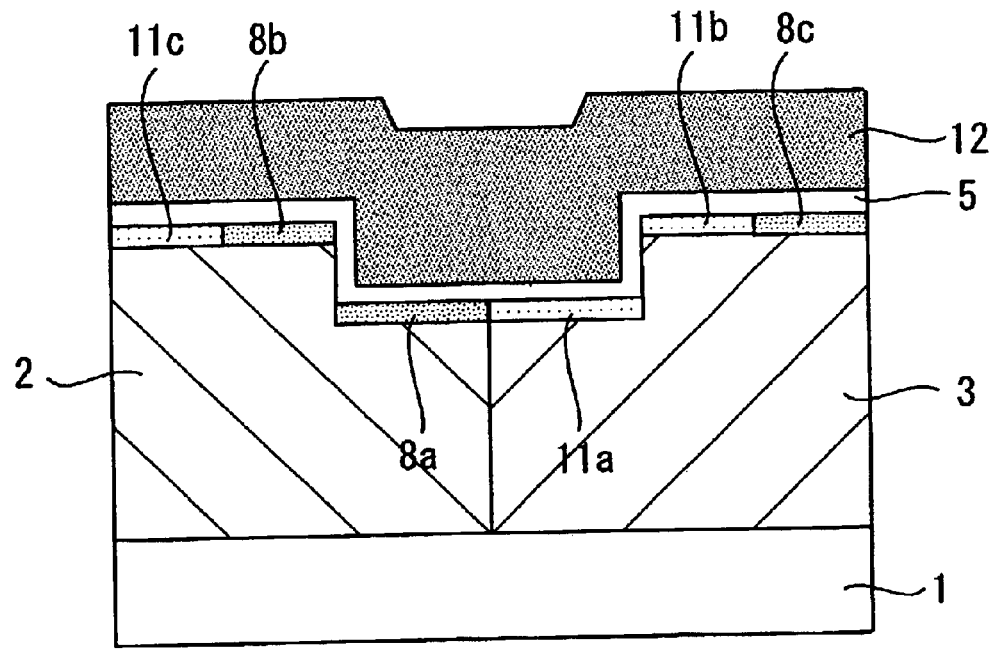

Next, as shown in FIG. 9, a polysilicon film 12 of a thickness of about 250 nm is formed on the entire surface of the silicon wafer 1.

Figure 10:
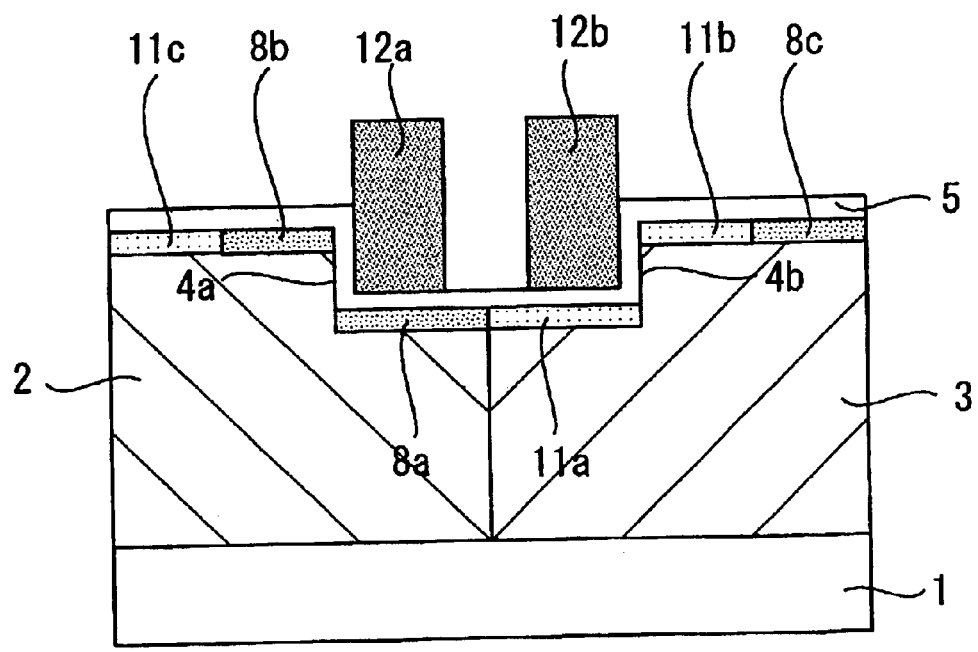

Then, as shown in FIG. 10, the polysilicon film 12 is patterned to form gate electrodes 12a and 12b.

Figure 11:
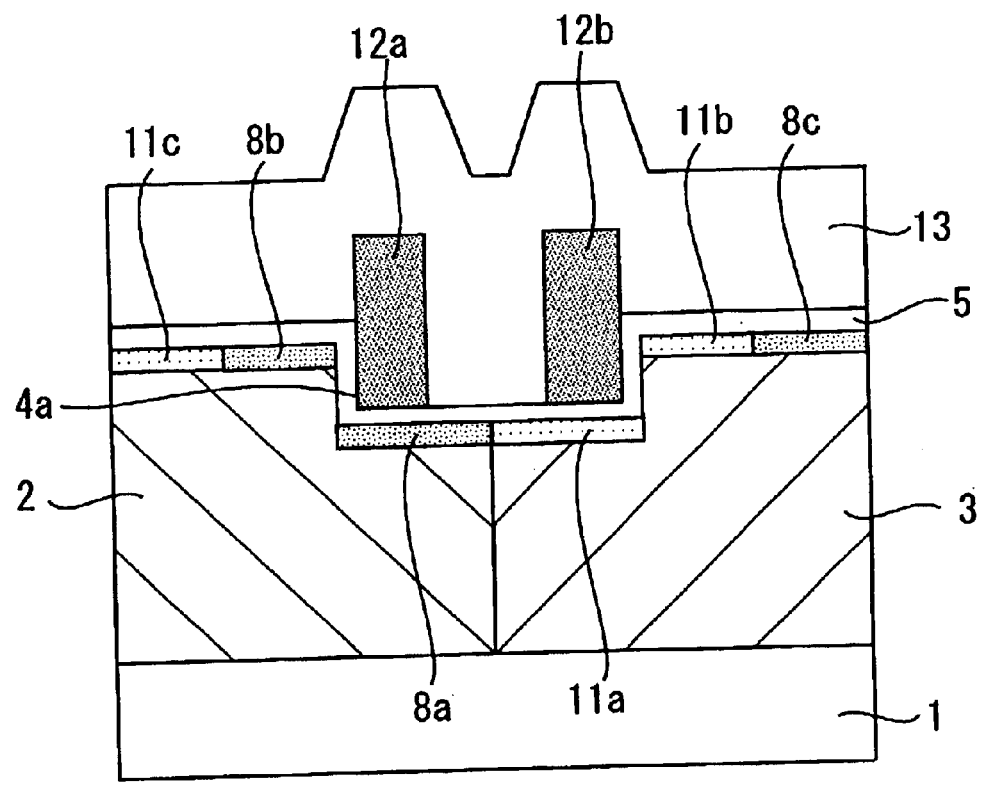

Next, as shown in FIG. 11, a silicon oxide film 13 of a thickness of about 30 nm to 40 nm is formed using a CVD method.

Figure 12:
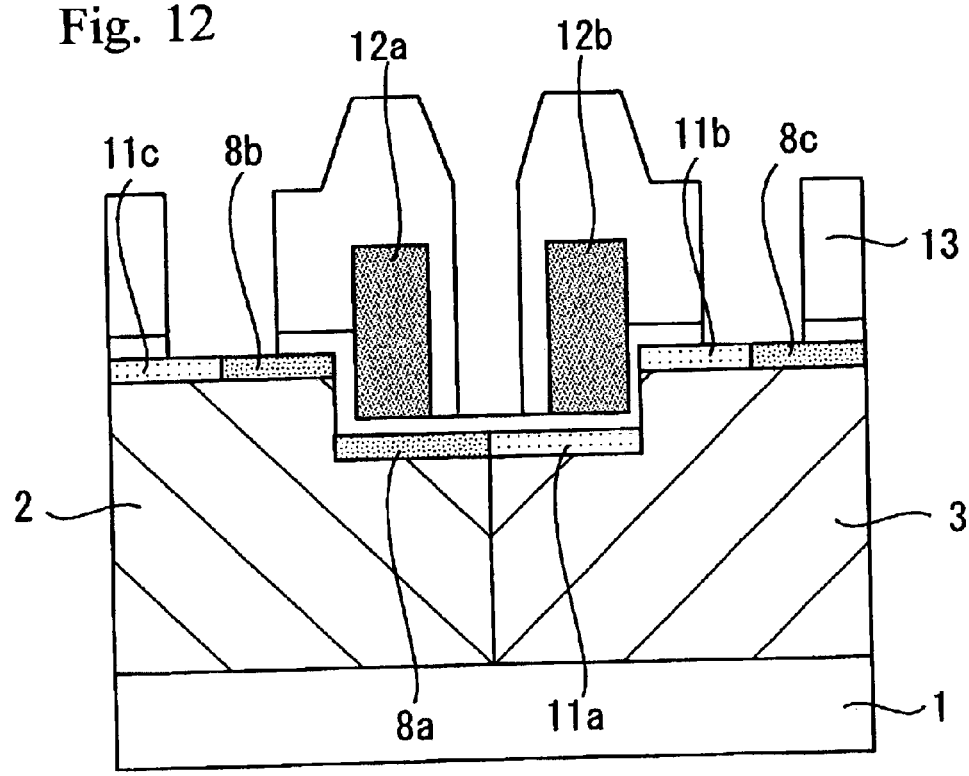

Then, as shown in FIG. 12, the silicon oxide film 13 is patterned.

Figure 13:
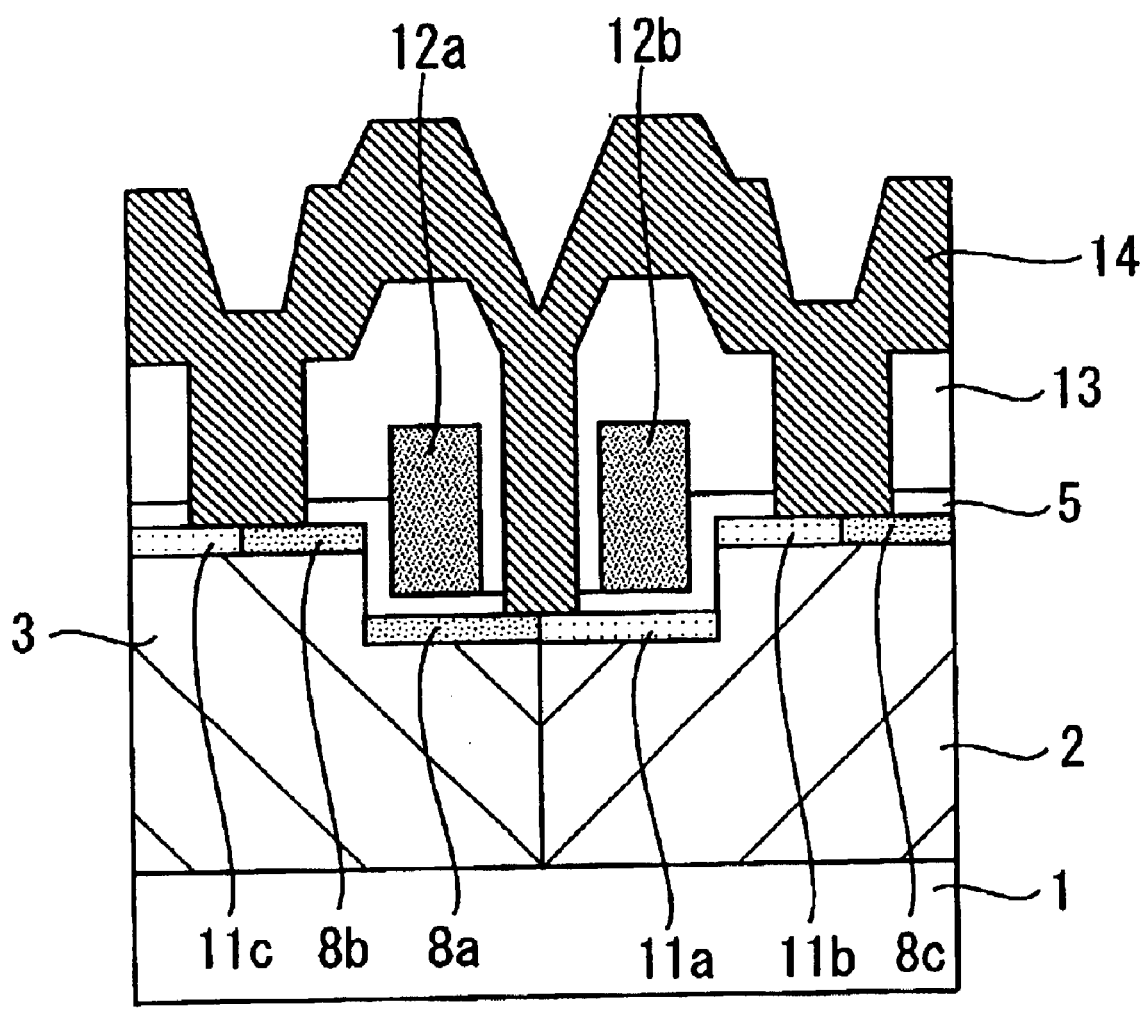

Next, as shown in FIG. 13, a conductive film 14, which becomes electrodes (input terminal electrode, output terminal electrode, grounding terminal electrode, and power terminal electrode) is formed. Here, the conductive 14 is, for example, an aluminum film, an aluminum-silicon film, an aluminum-silicon-copper film, or a tungsten film.

Finally, the conductive film 14 is patterned to form a semiconductor device as shown in FIG. 1.

According to this embodiment, as described above, a shallow trench 4 of a depth of 0.05 μm to 0.1 μm was formed in the vicinity of the boundary between impurity regions 2 and 3, and a complementary MOS transistor was formed in the shallow trench 4. Here, gate electrodes 12a and 12b were formed so that the upper surfaces of the gate electrodes 12a and 12b are higher than the surface of the silicon wafer 1. Therefore, no fine processing of the gate electrodes 12a and 12b is required.

Also, the width of the shallow trench 4 is 1 μm to 2 μm. Therefore, a minute transistor having a channel length of 0.1 μm or less can be manufactured easily using a technique to form a transistor having a channel length of 0.35 μm.

Also in this embodiment, since there is no epitaxial growth step, complicated process controls as in conventional manufacturing methods are required.

In addition, since there are less diffusion steps than in conventional manufacturing methods, increase in the number of process steps and the processing time can be prevented.

In this embodiment, although the first conductivity type is a p-type, and the second conductivity type is an n-type, this may be inversed, and the first conductivity type may be an n-type, and the second conductivity type may be a p-type.

This invention, when practiced illustratively in the manner described above, provides the following major effects:

According to the present invention, the densification and size reduction of a semiconductor device can be facilitated.

Further, the present invention is not limited to these embodiments, but variations and modifications may be made without departing from the scope of the present invention.

The entire disclosure of Japanese Patent Application No. 2002-322075 filed on Nov. 6, 2002 containing specification, claims, drawings and summary are incorporated herein by reference in its entirety.

What is claimed is:

1. A semiconductor device comprising
   a substrate in which a shallow trench having a depth of 0.05 μm to 0.1 μm is formed;
   a gate insulating film formed oh sidewalls and a bottom of said shallow trench, and a surface of said substrate contacting upper ends of said sidewalls;
   separate gate electrodes of CMOS transistors formed on the both sidewalls of said shallow trench each through said gate insulating film; and
   spaced apart impurity diffusion layers formed in the substrate below the bottom of said shallow trench, and at the surface of said substrate contacting the upper ends of said sidewalls of said shallow trench.

2. The semiconductor device according to claim 1, wherein the width of said shallow trench is 1 μm to 2 μm.

3. The semiconductor device according to claim 1, wherein an upper surface of said gate electrode is higher than the surface of said substrate.

* * * * *